United States Patent [19]

Ross et al.

[11] Patent Number: 5,399,313

[45] Date of Patent: Mar. 21, 1995

[54] NICKEL-BASED SUPERALLOYS FOR PRODUCING SINGLE CRYSTAL ARTICLES HAVING IMPROVED TOLERANCE TO LOW ANGLE GRAIN BOUNDARIES

[75] Inventors: Earl W. Ross; Carl S. Wukusick; Warren T. King, all of Cincinnati, Ohio

[73] Assignee: General Electric Company, Cincinnati, Ohio

[21] Appl. No.: 955,392

[22] Filed: Oct. 1, 1992

Related U.S. Application Data

[63] Continuation of Ser. No. 795,277, Nov. 20, 1991, abandoned, which is a continuation of Ser. No. 610,877, Nov. 9, 1990, abandoned, which is a continuation-in-part of Ser. No. 546,677, Jun. 28, 1990, abandoned, which is a continuation of Ser. No. 303,684, Jan. 11, 1989, abandoned, which is a continuation-in-part of Ser. No. 143,201, Jan. 11, 1988, abandoned, which is a continuation of Ser. No. 931,957, Nov. 24, 1986, abandoned, which is a continuation of Ser. No. 619,676, Jun. 11, 1984, abandoned, which is a continuation of Ser. No. 307,819, Oct. 2, 1981, abandoned, said Ser. No. 303,684, is a continuation of Ser. No. 893,470, Aug. 8, 1986, abandoned, which is a continuation of Ser. No. 595,854, Apr. 2, 1984, abandoned.

[51] Int. Cl.[6] .................................................... C22C 19/05
[52] U.S. Cl. ......................................... 420/448; 148/404; 148/410; 148/428
[58] Field of Search ................ 420/448; 148/404, 410, 148/428

[56] References Cited

U.S. PATENT DOCUMENTS

| | | | |
|---|---|---|---|
| 3,260,505 | 7/1966 | Ver Snyder | 253/77 |
| 3,494,709 | 2/1970 | Piearcey | 416/232 |
| 3,567,526 | 3/1971 | Gell et al. | 148/32.5 |
| 3,619,182 | 11/1971 | Bieber et al. | 420/448 |
| 3,897,815 | 8/1975 | Smashey | 164/127 |
| 4,116,723 | 9/1978 | Gell et al. | 148/3 |
| 4,152,488 | 5/1979 | Schilke et al. | 428/678 |
| 4,209,348 | 6/1980 | Duhl et al. | 148/3 |
| 4,222,794 | 9/1980 | Schweizer et al. | 148/3 |
| 4,261,742 | 4/1981 | Coupland et al. | 75/134 |
| 4,371,404 | 2/1983 | Duhl et al. | 148/3 |
| 4,402,772 | 9/1983 | Duhl et al. | 148/404 |
| 4,459,160 | 7/1984 | Meetham et al. | 148/3 |
| 4,582,548 | 4/1986 | Harris et al. | 148/404 |
| 4,643,782 | 2/1987 | Harris et al. | 148/404 |
| 4,719,080 | 1/1988 | Duhl et al. | 148/404 |
| 5,154,884 | 10/1992 | Wukusick et al. | 148/410 |

FOREIGN PATENT DOCUMENTS

| | | |
|---|---|---|
| 705385 | 3/1965 | Canada ............................ 148/410 |
| 0225837 | 6/1987 | European Pat. Off. . |
| 1288189 | 9/1972 | United Kingdom . |
| 2105748 | 3/1983 | United Kingdom . |
| 2110240B | 6/1983 | United Kingdom . |
| 2112812B | 6/1983 | United Kingdom . |
| 2121312 | 12/1983 | United Kingdom . |

*Primary Examiner*—Richard O. Dean
*Assistant Examiner*—Margery S. Phipps
*Attorney, Agent, or Firm*—Jerome C. Squillaro; David L. Narciso

[57] ABSTRACT

There is provided by the present invention nickel-base superalloys for producing single crystal articles having improved tolerance to low angle grain boundaries and an improved balance between cyclic oxidation and hot corrosion resistance. The improved tolerance arises from the discovery that nickel-base superalloys suitable for casting as single crystal articles can be improved by the addition of small, but controlled, amounts of boron and carbon, and optionally hafnium, and is manifested principally by improved grain boundary strength. As one result of this increased grain boundary strength, grain boundary mismatches far greater than the 6° limit for prior art single crystal superalloys can be tolerated in single crystal articles made from the nickel-base superalloys of this invention. This translates, for example, into lower inspection costs and higher casting yields as grain boundaries over a broader range can be accepted by visual inspection techniques without resort to expensive X-ray techniques. These alloys are especially useful when directionally solidified as hot-section components of aircraft gas turbine engines, particularly rotating blades and stationary vanes. The superalloy contains by weight percent, 7–12 Cr, 5–15 Co, 0.5–5 Mo, 3–12 W, 2–6 Ta, 2–5 Ti, 3–5 Al, 0–2 Cb, 0.1–0.2 Hf, 0.05–0.07 C, 0.002–0.05 B, and nickel.

11 Claims, 3 Drawing Sheets

NICKEL-BASED SUPERALLOYS FOR PRODUCING SINGLE CRYSTAL ARTICLES HAVING IMPROVED TOLERANCE TO LOW ANGLE GRAIN BOUNDARIES

The Government has rights in this invention pursuant to Contract No. F33657-81-C-2006 awarded by the Department of the Air Force.

CROSS-REFERENCE TO RELATED APPLICATIONS

This application is a continuation of application Ser. No. 07/795,277, filed Nov. 20, 1991, which is a continuation of application Ser. No. 07/610,877, filed Nov. 9, 1990, which is a continuation-in-part of copending application Ser. No. 546,677 filed Jun. 28, 1990 which is a continuation of application Ser. No. 303,684 filed Jan. 11, 1989, which is, in turn a continuation-in-part of application Ser. No. 143,201 filed Jan. 11, 1988, which is a continuation of application Ser. No. 931,957 filed Nov. 24, 1986, which is a continuation of application Ser. No. 619,676 filed Jun. 11, 1984, which is a continuation of application Ser. No. 307,819 filed Oct. 2, 1981. Application Ser. No. 303,684 is a continuation of application Ser. No. 893,470 filed Aug. 8, 1986, which is a continuation of application Ser. No. 595,854 filed April 2, 1984. All of the related applications have been abandoned.

BACKGROUND OF THE INVENTION

This invention pertains generally to nickel-base superalloys castable as single crystal articles of manufacture, which articles are especially useful as hot-section components of aircraft gas turbine engines, particularly rotating blades.

The efficiency of gas turbine engines depends significantly on the operating temperature of the various engine components with increased operating temperatures resulting in increased efficiencies. The search for increased efficiencies has led to the development of heat-resistant nickel-base superalloys which can withstand increasingly high temperatures yet maintain their basic material properties. The requirement for increased operating temperatures has also led to the development of highly complex cast hollow shapes, e.g., blades and vanes, which provide efficient cooling of the material used to produce such shapes.

The casting processes used with early generations of nickel-base superalloys, commonly referred to as conventionally cast nickel-base superalloys, generally produced parts whose microstructures consisted of a multitude of equiaxed single crystals (grains) of random (non-oriented) crystallographic orientation with grain boundaries between the grains. Grain boundaries are regions of highly nonoriented structure only a few atomic diameters wide which serve to accommodate the crystallographic orientation difference or mismatch between adjacent grains.

A high angle grain boundary (HAB) is generally regarded as a boundary between adjacent grains whose crystallographic orientation differs by more than about 5–6 degrees. High angle grain boundaries are regions of high surface energy, i.e., on the order of several hundreds of ergs/cm$^2$, and of such high random misfit that the structure cannot easily be described or modelled. Due to their high energies and randomness, high angle grain boundaries are highly mobile and are preferential sites for such solid-state reactions as diffusion, precipitation and phase transformations; thus, high angle boundaries play an important role in the deformation and fracture characteristics and chemical characteristics (e.g., resistance to oxidation and hot corrosion) of polycrystalline metals.

Also, due to the high energies and disorder of HABs, impurity atoms are attracted preferentially (segregated) to high angle grain boundaries to the degree that the concentration of impurity atoms at the grain boundary can be several orders of magnitude greater than the concentration of the same impurity atoms within the grains. The presence of such high concentrations of impurity atoms at high angle grain boundaries can further modify the mechanical and chemical properties of metals. For example, in nickel-base superalloys, lead and bismuth are deleterious impurities which segregate to the grain boundaries. At high temperatures, even small amounts (i.e., a few ppm) of such impurities in the grain boundaries of nickel-base superalloys degrade the mechanical properties (e.g., stress-rupture strength) and failure generally occurs at the grain boundaries.

In contrast to high angle grain boundaries, low angle grain boundaries, sometimes also called subgrain boundaries, are generally regarded as boundaries between adjacent grains whose crystallographic orientation differs by less than about 5 degrees. It is to be understood, however, that the classification of a boundary as high angle or low angle may vary depending upon the person or organization doing the classification. For the limiting case of a low angle boundary (LAB) where the orientation difference across the boundary may be less than 1 degree, the boundary may be described (modelled) in terms of a regular array of edge dislocations, i.e., a tilt boundary. While the mismatch is technically that between any two adjacent grains, and not that of the boundary per se, the extent of the mismatch is commonly assigned to the boundary; hence the terminology of, for example, a 5 degree low angle boundary, which usages shall be used herein interchangeably.

Low angle grain boundaries are more highly ordered and have lower surface energies than high angle grain boundaries. Higher order and lower energy result in boundaries with low mobility and low attraction for impurity atoms which, in turn, results in a lesser effect on properties, mechanical and chemical, compared to high angle grain boundaries. Thus, while no grain boundaries constitute a preferred condition, low angle boundaries are to be preferred over high angle grain boundaries.

Improvements in the ability of conventional superalloys to withstand higher temperatures without impairing other needed qualities, such as strength and oxidation resistance, was achieved through alloy development and the introduction of improved processing techniques. These improvements followed from findings that the strength of such superalloys, and other important characteristics, were dependent upon the strengths of the grain boundaries. To enhance such conventional superalloys, initial efforts were aimed at strengthening the grain boundaries by the addition of various grain boundary strengthening elements such as carbon (C), boron (B), zirconium (Zr), and hafnium (Hf) and by the removal of deleterious impurities such as lead (Pb) or bismuth (Bi) which tended to segregate at and weaken the grain boundaries.

Efforts to further increase strength levels in conventional nickel-base superalloys by preferentially orienting the grain boundaries parallel to the growth or solidification direction were subsequently initiated. Preferential orientation of the grains generally results in a columnar grain structure of long, slender (columnar) grains oriented in a single crystallographic direction and minimizes or eliminates grain boundaries transverse to the growth or solidification direction. The process used, i.e., directional solidification (DS), had long been used for other purposes such as the manufacture of magnets and grain-oriented silicon steel for transformers. That process has been described and improved upon, for instance, in U.S. Pat. No. 3,897,815—Smashey. The disclosures of all the U.S. Patents referred to herein are hereby incorporated by reference.

Compared with conventionally cast superalloy articles, directionally solidified (DS'd) articles exhibited increased strength when the columnar grains were aligned parallel to the principal stress axis due to the elimination or minimization of grain boundaries transverse to the direction of solidification. In addition, DS provided an increase in other properties, such as ductility and resistance to low cycle fatigue, due to the preferred grain orientation. However, reduced strength and ductility properties still existed in the transverse directions due to the presence of longitudinal columnar grain boundaries in such DS'd articles. Additions of Hf, C, B, and Zr were utilized to improve the transverse grain boundary strength of such alloys as was done previously in conventional equiaxed nickel-base superalloys. However, large additions of these elements acted as melting point depressants and resulted in limitations in heat treatment which did not allow the development of maximum strengths within such directionally solidified superalloys.

It has been recognized for some time that articles could be cast in various shapes as a perfect single crystal, thus eliminating grain boundaries altogether. A logical step then was to modify the DS process to enable solidification of superalloy articles as single crystals to eliminate longitudinally extending high angle grain boundaries previously found in DS'd articles.

In the single crystal metallic alloy arts, it has heretofore been conventional teaching that elements such as boron, zirconium, and carbon are to be avoided, i.e., kept to the lowest levels possible with commercial melting and alloying practice and technology. For example, U.S. Pat. No. 3,494,709 recites the deleterious effect of B and Zr, proposing limits of 0.001% and 0.01% for those elements, respectively. U.S. Pat. No. 3,567,526 teaches that the fatigue properties of single crystal superalloy articles can be improved by the complete removal of carbon.

In U.S. Pat. No. 4,116,723, there is disclosed homogeneous single crystal nickel-base superalloy articles having no intentional additions of cobalt (Co), B, Zr or C which are said to have superior mechanical properties, e.g., creep and time to rupture, compared to similar nickel-base superalloys containing Co, C, B, and Zr. Therein it is taught that cobalt should be restricted to less than about 0.5%, and more preferably to less than about 0.2%, to preclude the formation of deleterious topologically close packed phases (TCP) (e.g., $\sigma$ and $\mu$). Furthers it is taught therein that no single element of the group carbon, boron, and zirconium should be present in an amount greater than 50 ppm, that preferably the total of such impurities be less than 100 ppm and, most preferably, that carbon be kept below 30 ppm and that B and Zr each be kept below 20 ppm. In any event, it is taught that carbon must be kept below that amount of carbon which will form MC type carbides. Subsequently, in U.S. Pat. No. 4,209,348 it was shown that 3–7% Co could be included in the single crystal nickel-base superalloys disclosed there in without forming TCP.

Another purpose in limiting C, B, and Zr is to increase the incipient melting temperature in relation to the gamma prime solvus temperature thus permitting solutionizing heat treatments to be performed at temperatures where complete solutionizing of the gamma prime phase is possible in reasonable times without causing localized melting of solute-rich regions. Recently, however, it has been recognized, U.S. Pat. 4,402,772, that the addition of hafnium in small amounts to certain of nickel-base superalloys for the casting of single crystal articles is effective, or example, in providing enhanced properties and enhanced heat treatability in that such articles have a greater temperature range between the gamma prime solvus and incipient melting temperatures than do most prior art single crystal articles.

SUMMARY OF THE INVENTION

There is provided by the present invention nickel-base superalloys for producing single crystal articles having improved tolerance to low angle grain boundaries. The improved tolerance to low angle grain boundaries arises from the discovery that nickel-base superalloys suitable for casting as single crystal articles can, contrary to the teachings of the prior art, be improved by the addition of small, but controlled, amounts of boron and carbon, and optionally hafnium, and is manifested principally by improved grain boundary strength. Additionally, the superalloys of this invention also possess an improved balance between cyclic oxidation and hot corrosion resistance due primarily to the carbon and hafnium and an increased Al to Ti ratio.

As one result of this increased grain boundary strengths grain boundary mismatches far greater than the 6° limit for prior art single crystal superalloys can be tolerated in single crystal articles made from the nickel-base superalloys of this invention. This translates, for example, into lower inspection costs and higher yields as grain boundaries over a broader range can be accepted by the usual inspection techniques without resorting to expensive X-ray techniques. The superalloys of this invention are especially useful when directionally solidified as hot-section components of aircraft gas turbine engines, particularly rotating blades.

Broadly, the single-crystal superalloys of this invention consist essentially of about, by weight, 7–12% Cr, 5–15% Co, 0.5–5% Me, 3–12% W, 2–6% Ta, 2–5% Ti, 3–5% Al, 0–2% Cb, 0–2.0% Hf, 0.03–0.25% C and 0.002–0.050% B, the balance being nickel and incidental impurities.

DETAILED DESCRIPTION OF THE DRAWINGS

DETAILED DESCRIPTION OF THE INVENTION

Figure 1:
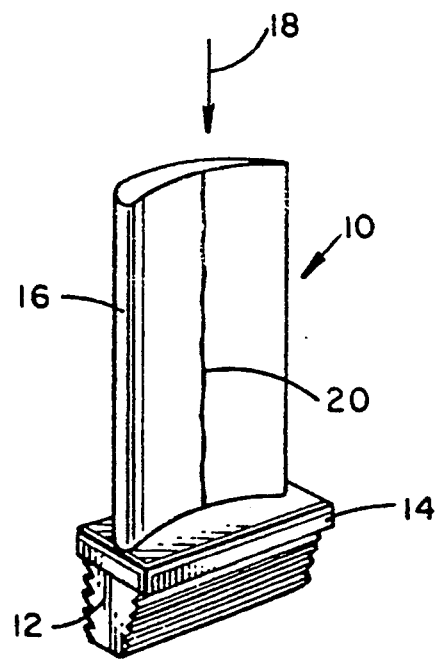
FIG. 1 is a perspective schematic view of a blade member for use in a gas turbine engine.

Nickel-base superalloys castable as single crystals have typically been used to manufacture airfoil members, e.g., rotating blades and stationary vanes, for the hot section of aircraft gas turbine engines. Such a blade member 10 is shown schematically in FIG. 1 and includes base (or root) portion 12 (shown machined to a "fir-tree" configuration for attachment to a disk), platform portion 14, and aerodynamically curved airfoil portion 16. Blade member 10 may also be provided with an internal passage or passages through which a fluid (generally air) is circulated during operation of the turbine for purposes of cooling the blade. Frequently, the fluid is forced out of holes situated at the leading and trailing edges of the airfoil to effect skin cooling by laminar flow of the fluid over the surface of the airfoil portion 16. Details of such cooling provisions are known in the art and are not shown here since they are unnecessary to an understanding of this invention. The art of directionally casting such blades is also known in the art as showns for examples by U.S. Pat. No. 3,494,709 and, therefore, also shall not be described here in detail.

Following directional solidifications which typically progresses downwardly toward base 12, in the direction indicated by arrow 18, the solidified blade member 10 is inspected for the presence of grain boundaries and verification of the axial growth direction 18. The axial growth direction is determined by X-ray analysis (typically by the well-known Laue method) and for nickel-base superalloys is preferably plus or minus 15 degrees of the [001] crystal direction.

Heretofore, only low angle grain boundaries, such as the one shown schematically at 20, up to a maximum of about 6° mismatch across adjacent grains have been permitted in single crystal blades 10. Skilled observers can generally visually detect LABs on the order of 0°-3°. Towards the maximum permissible mismatch of 6°, however, visual techniques become unreliable and additional Laue patterns on either side of the boundary in question must be made. The Laue patterns are not inexpensive and due to current single crystal practice 3 to 4 Laue patterns generally are required per casting. Presently, due in part to uncertainties in detecting low angle grain boundaries, the yield of castings is only about 45-55%.

It has now been discovered that nickel-base superalloys suitable for casting as single crystal articles can be improved by the addition of small, but controlled, amounts of boron and carbon, and optionally hafnium, yielding a new family of single crystal nickel-base superalloys.

The principal benefit, in addition to an improved balance between cyclic oxidation and hot corrosion resistance, following from this discovery is that low angle grain boundaries in single crystal articles made from the superalloys of the invention herein are stronger than their prior art single crystal articles. Therefore, LABs having greater than 6° of mismatch may be tolerated and accepted in such articles compared to about 6° maximum previously considered acceptable. Reduced inspection costs and increased yield or acceptable articles follows from the aforesaid improved tolerance to low angle grain boundaries. It will be appreciated that neither LABs nor HABs will be present in a true "single crystal." It will further be appreciated, however, that although there may be one or more low angle boundaries present in the single crystals discussed herein reference shall still be made to single crystals.

As noted above, single crystal articles such as blade 10 are subjected to an X-ray test to determine orientation and to a visual test to determine the presence (or absence) of high angle grain boundaries. While the X-ray test must still be used with the new superalloys of this invention to determine orientation, the number of X-ray tests required to distinguish between HABs and LABs is expected to be greatly reduced or eliminated.

Stated another way, the tolerance limits for accepting LABs visually can be increased from about 0°-3° to about 0-9° for the airfoil articles made from the new superalloys of this invention and Laue determinations are only expected to be required for boundaries greater than about 9°. It should be noted that large boundary mismatches are acceptable in the new superalloys when compared to the approximately 6° mismatches allowed in the prior art alloys. In the root and platform areas, there will be no limitation on the boundaries, i.e., HABs will be acceptable, due to the increased strength of the boundaries in articles made from the superalloys of this invention and in recognition of the lower temperatures in the platform and root portions compared to those in the airfoil portion. Thus, reference to a "single crystal article" herein shall be to an article at least a portion of which shall be in the nature of a "single crystal." Overall, the estimated casting yield of articles made from the new superalloys is expected to increase to 75-85%.

It will be appreciated, therefore, that the new superalloys of this invention possess exceptional properties even when processing by DS techniques results in articles having oriented high angle grain boundaries throughout. Exceptional properties are anticipated even when the superalloys of this invention are conventionally cast (CC) to produce articles having a plurality of randomly oriented grains with high angle grain boundaries therebetween.

Accordingly, there is provided by this invention a new family of nickel-base superalloys castable as single crystal articles having improved tolerance to low angle grain boundaries consisting essentially of chromium, cobalt, molybdenum, tungsten, tantalum, titanium, aluminum, columbium, hafnium, carbon, boron and (optionally) hafnium in the percentages (by weight) set forth in Table I, below, the balance being nickel and incidental impurities.

TABLE I

| | ALLOY COMPOSITIONS (weight %) | | |
| --- | --- | --- | --- |
| Elements | Base | Preferred | Most Preferred |
| Cr | 7-12 | 7-10 | 9.5-10.0 |
| Co | 5-15 | 5-10 | 7.0-8.0 |
| Mo | 0.5-5 | 1-3 | 1.3-1.7 |
| W | 3-12 | 4-8 | 5.75-6.25 |
| Ta | 2-6 | 3-5 | 4.6-5.0 |
| Ti | 2-5 | 3-4 | 3.4-3.6 |
| Al | 3-5 | 4-4.5 | 4.1-4.3 |
| Cb | 0-2 | 0-1 | 0.4-0.6 |
| Hf | 0-2.0 | 0.05-0.5 | 0.1-0.2 |
| C | 0.03-0.25 | 0.03-0.1 | 0.05-0.07 |
| B | 0.002-0.050 | 0.002-0.020 | 0.003-0.005 |

In Table II there is set forth the compositions of the various alloys, including those of the present invention, referred to herein.

TABLE II

ALLOY COMPOSITIONS[1]
(weight %)

| HEAT | Cr | Co | Mo | W | Ta | Ti | Al | Cb | Hf | C | B |
|---|---|---|---|---|---|---|---|---|---|---|---|
| Base[2] | 9.3 | 7.5 | 1.5 | 6.0 | 4.0 | 4.2 | 3.7 | 0.5 | — | — | — |
| 18 | 9.2 | 7.5 | 1.6 | 6.0 | 5.0 | 3.8 | 4.1 | 0.5 | 0.10 | — | — |
| 44 | 9.8 | 7.5 | 1.5 | 6.0 | 4.8 | 3.6 | 4.2 | 0.5 | 0 | 0.05 | 0 |
| 47 | 9.6 | 7.5 | 1.5 | 6.1 | 4.7 | 3.5 | 4.2 | 0.5 | 0.15 | 0.06 | 0 |
| 48 | 9.8 | 7.6 | 1.5 | 6.0 | 4.7 | 3.5 | 4.2 | 0.5 | 0.15 | 0.06 | 0.0018 |
| 49 | 9.7 | 7.5 | 1.5 | 6.0 | 4.7 | 3.5 | 4.2 | 0.5 | 0.15 | 0.05 | 0.0043 |
| 50 | 9.7 | 7.5 | 1.5 | 6.1 | 4.8 | 3.5 | 4.2 | 0.5 | 0.20 | 0.05 | 0.0030 |
| 59 | 9.6 | 7.4 | 1.5 | 6.0 | 4.7 | 3.4 | 4.2 | 0.5 | 0.19 | 0.05 | 0.0076 |
| 90 | 9.7 | 7.5 | 1.5 | 6.0 | 4.8 | 3.5 | 4.2 | 0.5 | 0.15 | 0.05 | 0.0046 |
| AA | 10.1 | 5.4 | — | 4.2 | 11.9 | 1.3 | 4.9 | — | — | 0.0038 | — |
| BB | 8.0 | 4.5 | 0.5 | 8.0 | 6.0 | 1.0 | 5.6 | — | 0.1 | — | — |
| R125 | 9.0 | 10.0 | 2.0 | 7.0 | 3.8 | 2.5 | 4.8 | — | 1.5 | 0.11 | 0.0150 |
| R80[3] | 14.0 | 9.5 | 4.0 | 4.0 | — | 5.0 | 3.0 | — | — | 0.17 | 0.0150 |

Figure 2:
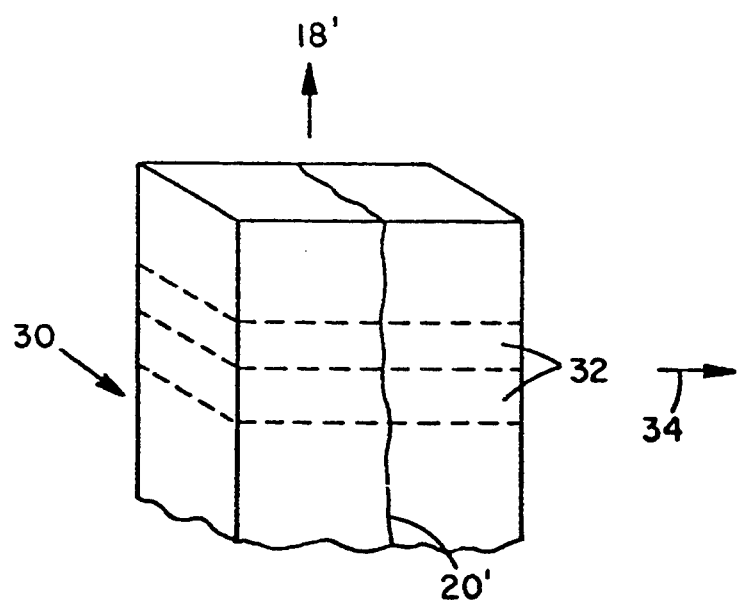
FIG. 2 is a perspective schematic view of a directionally solidified slab-like single crystal ingot marked for removal of blanks to be processed into mechanical property test specimens.

[1]The balance nickel plus incidental impurities
[2]Average of several heats
[3]Plus 0.030 Zr Shown schematically in FIG. 2 is the top portion of a slab-like ingot 30 directionally solidified in the direction of arrow 18' to produce material for testing. The material produced was either a single crystal which had no LABs or, as depicted in FIG. 2, had at least one LAB 20' parallel to solidification direction 18', or was conventionally DS'd to produce ingots having a plurality of HABs oriented parallel to solidification direction 18' (not illustrated). The ingots produced so as to have a plurality of oriented HABs were likewise produced by the same DS process but without the use of the techniques required to produce single crystals and will be referred to herein simply as DS or DS'd material. For comparative purposes, some of the alloys of Table I were also cast conventionally to produce ingots having a plurality of randomly oriented grains with high angle grain boundaries in between.

The heat treatment method used with the superalloys of the present invention to substantially fully develop a duplex gamma prime structure was to slowly heat the as DS'd ingot (or article) to about 2310° F. and hold thereat for about 2 hours to place the gamma prime phase into solid solution; cool at a rate of 100° F. to 150° F. per minute to below about 1975° F. then at a rate of about 75° F. to 150° F. per minute to about 1200° F. reheat to about 1975° F. for about four hours; cool at a rate of about 75° F. to 150° F. per minute to about 1200° F.; heat to about 1650° F. for about 16 hours; and, lastly, cool to ambient temperature.

The aforementioned specimens for physical property measurements were fabricated in conventional fashion from bar-like sections 32 taken transverse to solidification direction 18' the heat treated ingots. Each single crystal specimen from section 32 contained either no LABs or an LAB of known orientation established by X-ray analysis. Similarly, specimens from DS'd slabs contained a plurality of oriented grains and oriented high angle grain boundaries and specimens from CC slabs contained a plurality of randomly oriented grains and randomly oriented high angle grain boundaries.

Figure 3:
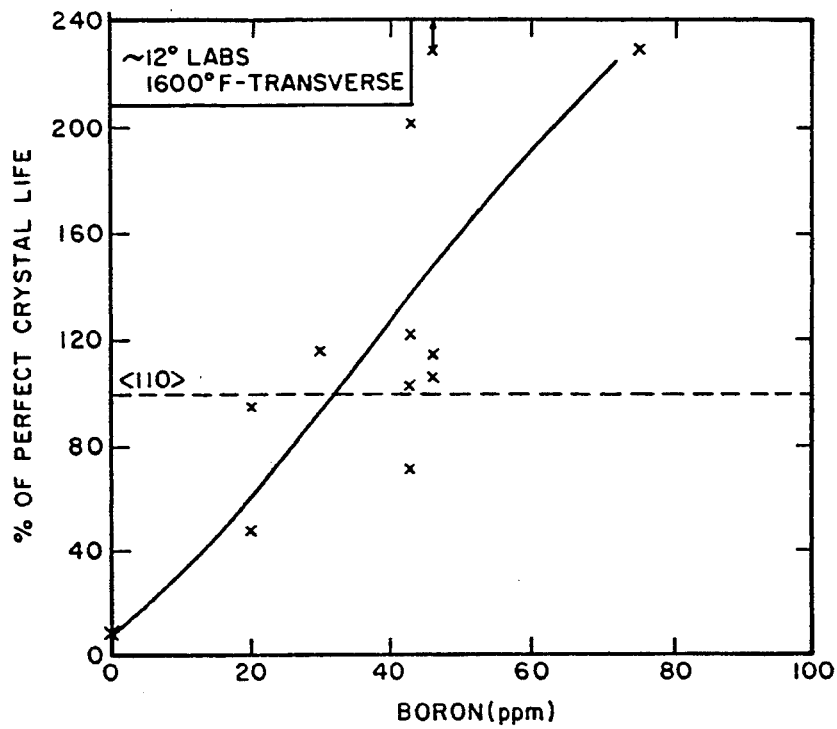
FIG. 3 is a graph of comparative stress-rupture life versus alloy boron content.
Figure 4:
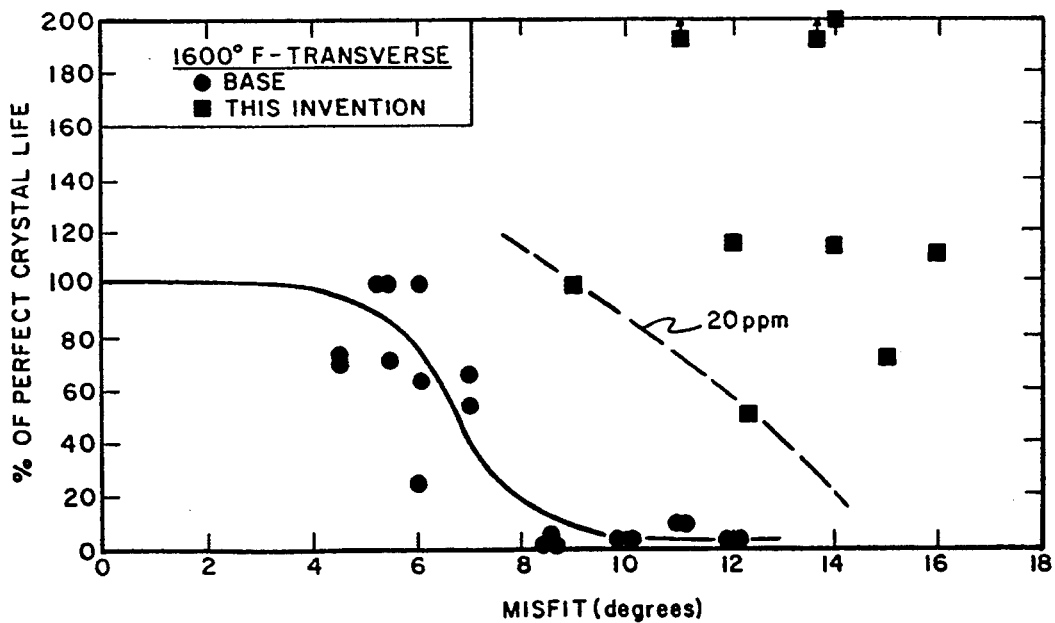
FIG. 4 is a graph of comparative stress-rupture life versus grain boundary misfit.

By reference to FIG. 3 and Table III, it may be seen that boron has been discovered, contrary to the teachings of the prior art, to be beneficial to the stress-rupture strength of single crystals and, with carbons strengthens any LABs present in single crystals made from the alloys of this invention. In FIGS. 3 and 4 and Tables III and IV, reference is made to "% of Perfect Crystal Life" which is the stress-rupture life of an alloy of the Base composition (Table II) DS'd to form no LABs and tested with its [110] direction perpendicular to the DS direction (and parallel to the specimen stress axis) at the same conditions of stress and temperature as the superalloy for which it serves as the comparative standard. Also in some Tables, there is set forth for comparative purposes the stress-rupture lives of specimens of the Base composition having a LAB with the degree of mismatch shown and for specimens of the Base composition in the DS'd condition.

TABLE III-A

TRANSVERSE[1] STRESS-RUPTURE PROPERTIES

| | | | | | STRESS-RUPTURE PROPERTIES | | | |
|---|---|---|---|---|---|---|---|---|
| NO. | HEAT | B (ppm) | Hf (%) | LAB (deg) | TEMP (°) | STRESS (ksi) | LIFE (hrs) | ELONG (%) | R OF A (%) |
| 1 | 47 | — | 0.15 | 12.6 | 1600 | 58 | 24.6 | 0.4 | 0.0 |
| 2 | 47 | — | 0.15 | 11.9 | 1600 | 58 | 10.3 | 0.6 | 1.2 |
| 3 | 48 | 20 | 0.15 | 9.2 | 1600 | 58 | 146.0 | 0.6 | 0 |
| 4 | 48 | 20 | 0.15 | 12.2 | 1600 | 58 | 77.7 | 1.3 | 0 |
| 5 | 50 | 30 | 0.20 | 12.0[3] | 1600 | ~55 | 175.1 | 2.4 | 1.8 |
| 6 | 49 | 43 | 0.15 | 14.0 | 1500 | 75 | 185.0[2] | 2.1 | 2.5 |
| 7 | 49 | 43 | 0.15 | 14.0 | 1600 | 58 | 304.0[4] | 3.8 | 2.5 |
| 8 | 49 | 43 | 0.15 | ~31 | 1600 | 58 | 48.8 | 1.3 | 0.6 |
| 9 | 49 | 43 | 0.15 | ~31 | 1600 | 58 | 46.3 | 1.8 | 0.6 |
| 10 | 49 | 43 | 0.15 | 15 | 1600 | 58 | 109.8 | 0.9 | 1.2 |
| 11 | 59 | 75 | 0.20 | 13.6 | 1600 | 58 | 347.9 | 1.9 | 1.8 |
| 12 | 90 | 46 | 0.15 | 11 | 1600 | 58 | 380.1 | 3.9 | 24.9 |
| 13 | 90 | 46 | 0.15 | 14 | 1600 | 58 | 171.4 | 1.8 | 2.5 |
| 14 | 90 | 46 | 0.15 | 16 | 1600 | 58 | 168.0 | 2.5 | 3.7 |

TABLE III-A-continued

TRANSVERSE[1] STRESS-RUPTURE PROPERTIES

| NO. | HEAT | -B (ppm) | Hf (%) | LAB (deg) | TEMP (°) | STRESS (ksi) | LIFE (hrs) | ELONG (%) | R OF A (%) |
|---|---|---|---|---|---|---|---|---|---|
| 15 | 49 | 40 | 0.15 | 14.0 | 1700 | 45 | 92.2 | 2.5 | 0.7 |
| 16 | 49 | 43 | 0.15 | 14 | 1800 | 30 | 108.7 | 1.9 | 1.3 |
| 17 | 49 | 43 | 0.15 | 15 | 1800 | 24 | 124.7 | 2.5 | 0.6 |
| 18 | 49 | 43 | 0.15 | 15 | 1800 | 30 | 33.3 | 0.9 | 0.0 |
| 19 | 50 | 30 | 0.20 | 12[3] | 1800 | 28 | 234.0[5] | NA | NA |
| 20 | 90 | 46 | 0.15 | 11 | 1800 | 30 | 118.8 | 2.6 | 0.6 |
| 21 | 90 | 46 | 0.15 | 14 | 1800 | 24 | 296.1 | 1.8 | 0 |
| 22 | 90 | 46 | 0.15 | 14 | 1800 | 30 | 51.0 | 1.6 | 2.5 |
| 23 | 90 | 46 | 0.15 | 16 | 1800 | 30 | 73.1 | 3.3 | 0.8 |

[1]Transverse across LABs (or HABs) and transverse to solidification direction.
[2]No failure in time shown - was step loaded to 104.8 ksi/3 hrs then step loaded to 134.7 ksi/failure in 1 min.
[3]In radius section of specimen
[4]No failure in time shown - step loaded to 78 ksi/failure in 4.7 addn'l hrs.
[5]No failure in time shown - step loaded to 50 ksi/failure.

TABLE III-B

COMPARATIVE STRESS RUPTURE PROPERTIES

| NO. | HEAT | LIFE (hrs) | BASE ALLOY NO LAB (hrs) | (%) | BASE ALLOY LAB (deg) | LIFE (hrs) | BASE ALLOY DS'd (hrs) | CC R80 (hrs) |
|---|---|---|---|---|---|---|---|---|
| 1 | 47 | 24.6 | 150 | 16.4 | 12 | 2 | 3 | 30 |
| 2 | 47 | 10.3 | 150 | 6.9 | 12 | 2 | 3 | 30 |
| 3 | 48 | 146.0 | 150 | 97.3 | 10 | 15 | 3 | 30 |
| 4 | 48 | 77.7 | 150 | 51.8 | 12 | 2 | 3 | 30 |
| 5 | 50 | 175.1 | 150 | 116.7 | 12 | 2 | 3 | 30 |
| 6 | 49 | 185.0[2] | 150 | 123.3 | NA | | 10 | 45 |
| 7 | 49 | 304.0[4] | 150 | 202.7 | NA | | 3 | 30 |
| 8 | 49 | 48.8 | 150 | HAB | NA | | 3 | 30 |
| 9 | 49 | 46.3 | 150 | HAB | NA | | 3 | 30 |
| 10 | 49 | 109.8 | 150 | 73.2 | 12 | 2 | 3 | 30 |
| 11 | 59 | 347.9 | 150 | 231.9 | 12 | 2 | 3 | 20 |
| 12 | 90 | 380.1 | 150 | 253.4 | 11 | 2-15 | | 30 |
| 13 | 90 | 171.4 | 150 | 114.3 | NA | | | 30 |
| 14 | 90 | 168.0 | 150 | 112.0 | NA | | | 30 |
| 15 | 49 | 92.2 | 90 | 102.4 | NA | | 0.5 | |
| 16 | 49 | 108.7 | 100 | 108.7 | NA | | | |
| 17 | 49 | 124.7 | 375 | 33.3 | NA | | | |
| 18 | 49 | 33.3 | 100 | 33.3 | NA | | | |
| 19 | 50 | 234.0[5] | 250 | 93.6 | NA | | | |
| 20 | 90 | 118.8 | 100 | 118.8 | 11 | 36 | | |
| 21 | 90 | 296.1 | 375 | 79.0 | NA | | | |
| 22 | 90 | 51.0 | 100 | 51.0 | NA | | | |
| 23 | 90 | 73.1 | 100 | 73.1 | NA | | | |

That the superalloys of the invention have superior stress-rupture strengths compared to conventional single crystal superalloys at any given angle of mismatch from 0° to about 18° is shown in FIG. 4. Similarly, at any given level of % of no LAB rupture life the superalloys of the invention can tolerate larger degrees of misfit, on the order of about 2 times, than can single crystal superalloys of the prior art. As may be noted from Table IV, even when DS'd to form HABs, the superalloys of the invention have superior stress-rupture strengths.

TABLE IV

STRESS-RUPTURE STRENGTHS[1]
(DS'd High Angle Boundary Specimens)

| HEAT | B (ppm) | TEMP (°) | STRESS (ksi) | LIFE (hrs) | ELONG (%) | R OF A (%) | BASE NO LAB 110 | DS BASE | CC R80 |
|---|---|---|---|---|---|---|---|---|---|
| 47 | 0 | 1400 | 90 | 4.0 | 0.9 | 0.0 | 220 | NA | 100 |
| | | 1600 | 55 | 1.9 | 1.0 | 0.0 | 230 | <3 | 45 |
| | | 1800 | 26 | 2.3 | 2.1 | 2.7 | 250 | <1 | 65 |
| | | 2000 | 12 | 3.1 | 1.0 | 0.0 | 250 | <4 | 10 |
| 48 | 20 | 1400 | 90 | 3.3 | 0.8 | 0.0 | 220 | NA | 100 |
| | | 1600 | 55 | 15.6 | 0.6 | 0.8 | 230 | <3 | 45 |
| | | 1800 | 26 | 9.2 | 1.1 | 0.0 | 250 | <1 | 65 |
| | | 2000 | 12 | 4.5 | 0.0 | 0.0 | 250 | <4 | 10 |
| 50 | 30 | 1400 | 90 | 184.4[2] | 1.9 | 3.8 | 220 | NA | 100 |
| | | 1600 | 55 | 69.2 | 1.5 | 0.0 | 230 | <3 | 45 |

TABLE IV-continued

STRESS-RUPTURE STRENGTHS[1]
(DS'd High Angle Boundary Specimens)

| HEAT | B (ppm) | TEMP (°) | STRESS (ksi) | LIFE (hrs) | ELONG (%) | R OF A (%) | BASE NO LAB 110 | DS BASE | CC R80 |
|---|---|---|---|---|---|---|---|---|---|
|  |  | 1800 | 26 | 65.6 | 1.0 | 0.0 | 250 | <1 | 65 |
|  |  | 2000 | 12 | 9.1 | 1.6 | 1.3 | 250 | <4 | 10 |
| 49 | 43 | 1400 | 90 | 92.5[3] | 3.7 | 6.2 | 220 | NA | 100 |
|  |  | 1600 | 55 | 133.8 | 1.3 | 2.5 | 230 | <3 | 45 |
|  |  | 1800 | 26 | 50.0 | 1.2 | 0.0 | 250 | <1 | 65 |
|  |  | 2000 | 12 | 2.9 | 1.9 | 2.0 | 250 | <4 | 10 |
|  |  | 2000 | 12 | 1.8 | NA | 0.0 | 250 | <4 | 10 |
| 59 | 75 | 1400 | 90 | 92.4[4] | 10.8 | 32.0 | 220 | NA | 100 |
|  |  | 1600 | 55 | 54.1 | 0.9 | 0.0 | 230 | <3 | 45 |
|  |  | 1800 | 26 | 98.1 | 1.7 | 0.6 | 250 | <1 | 65 |
|  |  | 2000 | 12 | 4.1 | NA | 0.6 | 250 | <4 | 10 |
| AA | — | 1600 | 50 | 0.3 | — | — | — | — | — |

COMPARATIVE STRESS-RUPTURE LIVES (HRS)

[1]All transverse to DS direction except for CC
[2]Step Loaded
to 100 KSI + 2.2 hrs
to 110 KSI + .8 hrs
to 120 KSI + .2 hrs
[3]Step Loaded
to 110 KSI + 21.9 hrs
120 KSI + 2.1 hrs
130 KSI + .2 hrs
140 KSI + 1.3
150 KSI + .3 hrs
[4]Step Loaded
110 KSI + 21.8 hrs
120 KSI + 2.2 hrs
130 KSI + .1 hrs
140 KSI + .2 hrs Table V presents the results of cyclic oxidation tests on uncoated ¼"×3" long round pin specimens conducted under the conditions shown in the table using a natural gas flame at Mach 1 gas velocity. The specimens were rotated for uniform exposure and cycled out of the flame once per hour to cool the specimens to room temperature. External metal loss was measured on a section cut transverse to the length dimension of the specimen. Metal loss per side was found by dividing the difference between the pin diameter before and after test by two. The data in the table are the average of two such measurements at 90° to each other across the diameter of the specimen.

Figure 5:
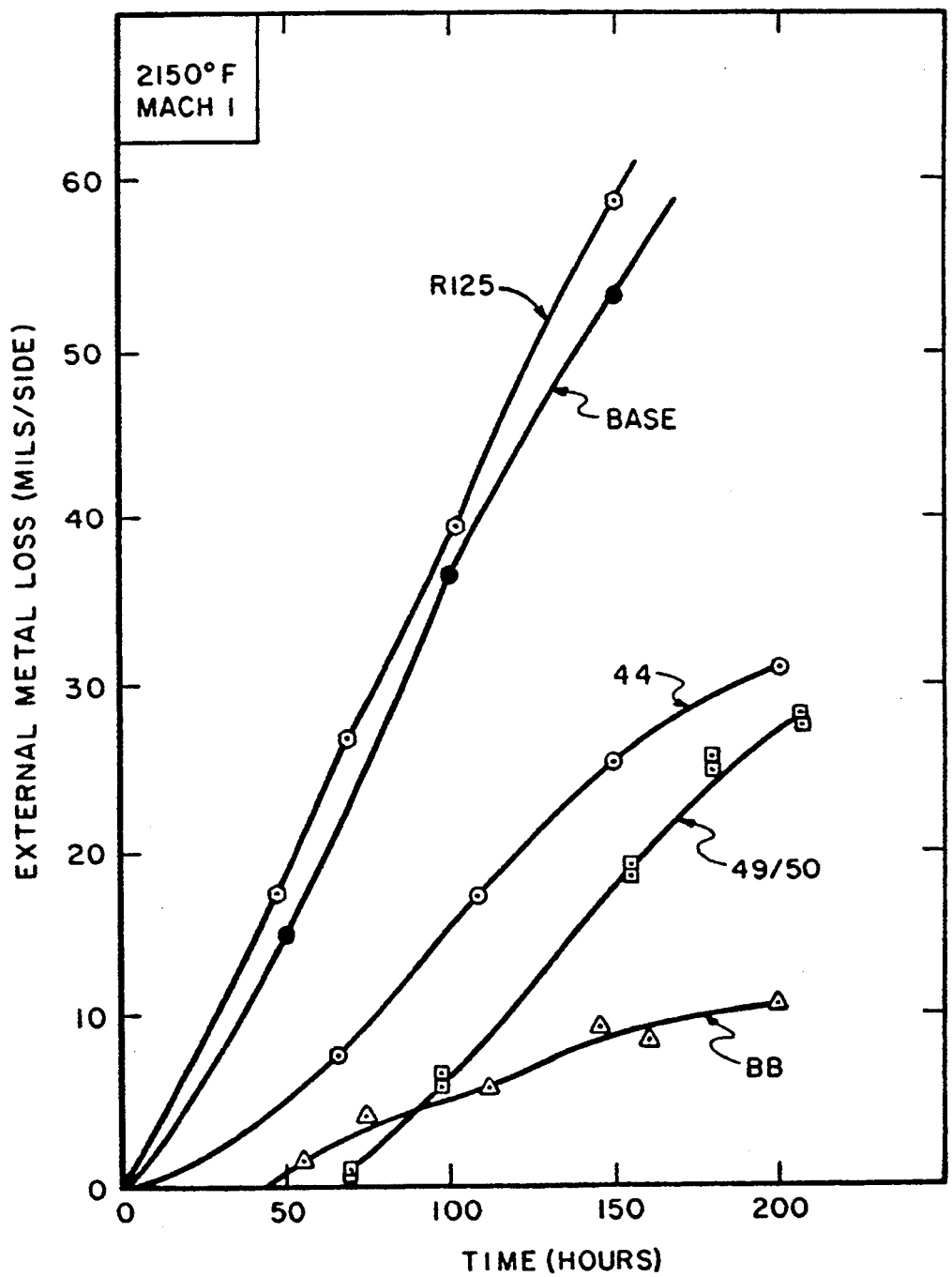
FIG. 5 is a graph of external metal loss in cyclic oxidation as a function of exposure time.

The data of Table V are presented in graphical form in FIG. 5. It may be noted that while the resistance of the superalloys of the invention to cyclic oxidation is not as good as exemplary alloy BB, the superalloys of the invention possess highly acceptable resistance to cyclic oxidation which is an improvement over the cyclic oxidation resistance of the Base alloy and R125. The improved cyclic oxidation resistance of the superalloys of this invention compared to that of the Base superalloy is believed to be due primarily to the increased Al to Ti ratio. Comparison of the data for heats 44 and 49/50 shows the further increased cyclic oxidation resistance provided by the addition of hafnium.

TABLE V

CYCLC OXIDATION TESTS
(MACH 1)
CYCLED TO RT ONCE/HR
EXTERNAL METAL LOSS (MILS/SIDE)

| HEAT | TEMP | 71 | 89 | 99 | 133 | 157 | 181 | 200 | 207 |
|---|---|---|---|---|---|---|---|---|---|
| 47 | 2075 |  | 0 |  | 0.25 |  |  | 0.25 [7.5][2] |  |
| 48 | 2075 |  | 0 [7.5] |  | 0.5 [10.5] |  |  | 1.0 [18.3) |  |
| 50 | 2075 |  | 0.25 |  | 0.5 |  |  | 1.0 |  |
| 59 | 2075 |  | 0 |  | 0.25 |  |  | 0.5 [4.0] |  |
| Base[1] | 2075 |  | 15.0 |  | 22.5 |  |  | 36.5 |  |
| AA | 2075 |  | 4.0 |  | 6.5 |  |  | 10.0 |  |
| 47 | 2150 | 0.5 |  | 5.5 |  | 20.3 | 23.5 |  | 25.5 |
| 48 | 2150 | 3.7 |  | 6.0 |  | 21.3 | 25.8 |  | 29.5 |
| 49 | 2150 | 0.5 |  | 5.7 |  | 18.8 | 25.0 |  | 27.1 |
| 50 | 2150 | 0.3 |  | 5.5 |  | 18.5 | 24.8 |  | 28.3 |
| 59 | 2150 | — |  | 13.5 |  | 23.8 | 30.8 |  | 34.0 |
| Base[1] | 2150 | 22.2 |  | 36.1 |  | 53.5 |  |  | 73.2 |
| R125 | 2150 | 26.3 |  | 39.5 |  | 58.8 |  |  | 83.8 |

TIME (HRS)

[1]Average of several heats
[2][ ] indicates depth of single pit (mils)

Table VI presents the results of hot corrosion tests on uncoated ⅛"×2" long round pin specimens conducted under the conditions shown in the table using a JP-5 fuel-fired flame with salt in parts per million (ppm)

shown added to the combustion products. The specimens were rotated for uniform exposure and were cycled out of the flame to room temperature once every day. The data of Table VI show that the presence of carbon in the superalloys of the invention is required for hot corrosion resistance and that the hot corrosion resistance of the superalloys of the invention is superior to that of alloys AA and BB—prior art single crystal alloys.

The superalloys of the invention thus have an improved balance between cyclic oxidation and hot corrosion resistance due primarily to the carbon and hafnium and an increased Al to Ti ratio in comparison to the Base alloy.

TABLE VI

| | HOT CORROSION TESTS | | | |
|---|---|---|---|---|
| HEAT | TEMP (°) | SALT (ppm) | TIME (Hrs) | METAL LOSS (mils/side) |
| 44 | 1600 | 1 | 613 | 1.7 |
| Base | 1600 | 1 | 613 | 1.0 |
| 18 | 1600 | 2 | 402 | 36.0 |
| 44 | 1600 | 2 | 620 | 1.0 |
| Base | 1600 | 2 | 620 | 1.5 |
| AA | 1600 | 2 | 470 | 11.8 |
| BB | 1600 | 2 | 620 | 28.0 |
| 44 | 1700 | 5 | 478 | 6.6 |
| Base | 1700 | 5 | 478 | 11.3 |
| AA | 1700 | 5 | 478 | 30.1 |

A number of observations have been made with respect to the metallic components in the alloys of this invention and the contribution they make to the properties of the final product.

Cr above about 12% and below about 7% results in the presence of undesirable oxides at aluminum levels of 3–5%. The presence of such Cr oxides will result in reduced oxidation resistance. An increase in Al will then effectively reduce hot corrosion resistance. Therefore, a careful balance must be maintained between Cr and Al to provide good oxidation and hot corrosion resistance. The range for Cr is 7–12% and Al is 3–5%.

Aluminum is added primarily for strength through $Ni_3Al$ (gamma prime) formation. Al is important for oxidation resistance but must maintain the $Ni_3Al$ structure. Cb, Ta, and Ti can be substituted for Al for purposes of gamma prime strengthening since too much Al, for example, substantially greater than about 5%, will result in instability of the gamma prime. Less than about 2% Al will not allow the formation of sufficient gamma prime to develop adequate strength. For the alloy of the present invention, the Al range is 3–5%.

Titanium is normally present as a gamma prime strengthener. Its presence also is important in oxidation reactions, although it is not as desirable as other elemental additions, such as Al. Ti, if employed in the superalloys of the invention, reduces the requirement for Al to produce gamma prime thus freeing Cr to act primarily to improve corrosion resistance, i.e., increases the Cr:Al ratio. Therefore, for improved corrosion resistance, the present invention provides an alloy with a Cr:Al ratio greater than known alloys of the type previously used for single crystal structures.

The presence of Ti in amounts exceeding about 5% will result in a loss of oxidation and corrosion resistance and the formation of $Ni_3Ti$, an unwanted phase. In amounts less than about 3%, the Ti will not be present in an amount sufficient to maximize corrosion resistance in those superalloys where this is important.

Tungsten is an effective gamma and gamma prime strengthener partitioning equally between the two phases. The presence of W generally increases the melting point of nickel and is a viable alloying element for high temperature strength. The maximum level of W in the alloy of the present invention has been determined to be about 12% for single grain articles. Instabilities have been observed above this level. The presence of W in general can be detrimental to both high temperature oxidation and hot corrosion resistance. However, below about 3%, W has little effect on the properties of the alloy. It is preferred to limit the amount of W present to intermediate levels of about 4–8%.

Columbium behaves much the same as Ti and Ta, being present in the $Ni_3Al$ (gamma prime) phase. The solubility of Cb in $Ni_3Al$ is less than either Ti or Ta. The presence of Cb, although beneficial to overall properties in small amounts, depresses the alloy melting point above levels of about 2% more rapidly than Ta and is therefore limited to lower amounts when used in the alloy of the present invention.

Tantalum acts like Ti in nickel-base superalloys, partitioning almost entirely to the gamma prime phase. Ta is preferred over Ti because of its high melting point and the fact that it does not depress the alloy melting point as much as does Ti. Ta also aids in promoting corrosion resistance by inhibiting surface $Al_2O_3$ formation. Ta is a heavy element having a much higher density than Ti. Thus, by emphasizing Ti rather than Ta, a lighter article can be achieved while still providing greater hot corrosion resistance due to the presence of Ti. However, some Ta, in amounts of 2–6%, is beneficial for participation in the corrosion resistance and strengthening mechanisms.

Cobalt is beneficial in nickel-base superalloys in at least two ways. Co tends to raise the solid solubility temperature of gamma prime, thereby increasing temperature capability of the alloys. About 5% Co tends to improve structural stability by inhibiting sigma precipitation, while larger amounts, greater than about 15%, will contribute to sigma instability. In Ni-base superalloys, Co contributes to improved castability. Cobalt preferably at the 5–10% level has been found to be a valuable addition to turbine blade alloys and is a constituent of the alloy of this invention.

Mo acts like W, but has a lower density and is generally less effective as a strengthener than is W. Also, Mo tends to be detrimental to corrosion resistance at low Cr levels, such as less than about 7% Cr. Relatively higher Mo contents, up to about 5%, can be tolerated in the presence of higher Cr contents. However, in the alloy of the present invention, which has higher Cr contents, a small amount of Mo will result in an added strength benefit. Beyond about 3% Mo, increased strength benefit is not realized and the detrimental effects on corrosion resistance becomes noticeable at greater than about 5% Mo.

There being extant evidence that the inventive concepts herein of adding small, but controlled, amounts of boron and carbon, and optionally hafnium, to improve the low angle grain boundary tolerance of nickel-base superalloys suitable for casting as single crystal articles are applicable to other nickel-base single crystal superalloys, it will be understood that various changes and modifications not specifically referred to herein may be made in the invention herein described, and to its uses herein described, without departing from the spirit of the invention particularly as defined in the following claims.

What is claimed is:

1. A nickel-base superalloy consisting essentially of, in percentages by weight, 9.5–10.0 Cr, 7.0–8.0 Co, 1.3–1.7 Mo, 5.75–6.25 W, 4.6–5.0 Ta, 3.4–3.6 Ti, 4.1–4.3 Al, 0.4–0.6 Cb, 0.1–0.2 Hf, 0.05–0.07 C and 0.003–0.005 B, the balance being nickel and incidental impurities.

2. A single crystal article of manufacture the overall composition of which is a nickel-base superalloy consisting essentially of, in percentages by weight, 9.5–10.0 Cr, 7.0–8.0 Co, 1.3–1.7 Mo, 5.75–6.25 W, 4.6–5.0 Ta, 3.4–3.6 Ti, 4.1–4.3 Al, 0.4–0.6 Cb, 0.1–0.2 Hf, 0.05–0.07 C and 0.003–0.005 B, the balance being nickel and incidental impurities, wherein any low angle grain boundaries present in said article are greater than about 0°.

3. The article of claim 2 wherein any low angle grain boundaries present therein are in the range of from about 0° to about 20°.

4. The article of claim 3 which is an airfoil member for a gas turbine engine.

5. An article of manufacture the overall composition of which is nickel-base superalloy consisting essentially of, in percentages by weight, 9.5–10.0 Cr, 7.0–8.0 Co, 1.3–1.7 Mo, 5.75–6.25 W, 4.6–5.0 Ta, 3.4–3.6 Ti, 4.1–4.3 Al, 0.4–0.6 Cb, 0.1–0.2 Hf, 0.05–0.07 C and 0.003–0.005 B, the balance being nickel and incidental impurities, at least a portion of which is a single crystal.

6. The article of claim 5 wherein any low angle grain boundaries present in said single crystal portion are greater than about 0°.

7. The article of claim 6 wherein any low angle grain boundaries present in said single crystal portion are in the range of from about 0° to about 20°.

8. The article of claim 6 which is an airfoil member for a gas turbine engine at least the airfoil portion of which is said single crystal portion.

9. An article of manufacture the overall composition of which is a nickel-base superalloy consisting essentially of, in percentages by weight, 9.5–10.0 Cr, 7.0–8.0 Co, 1.3–1.7 Mo, 5.75–6.25 W, 4.6–5.0 Ta, 3.4–3.6 Ti, 4.1–4.3 Al, 0.4–0.6 Cb, 0.1–0.2 Hf, 0.05–0.07 C and 0.003–0.005 B, the balance being nickel and incidental impurities.

10. The article of claim 9 which is directionally solidified.

11. The article of claim 9 which is conventionally cast.

* * * * *